(12) United States Patent
Nakamura et al.

(10) Patent No.: US 8,860,146 B2
(45) Date of Patent: Oct. 14, 2014

(54) SEMICONDUCTOR DEVICE

(75) Inventors: Yuki Nakamura, Kanagawa-ken (JP);
Takehito Ikimura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 696 days.

(21) Appl. No.: 13/052,014

(22) Filed: Mar. 18, 2011

(65) Prior Publication Data

US 2012/0001269 A1    Jan. 5, 2012

(30) Foreign Application Priority Data

Jul. 1, 2010    (JP) .................................. 2010-151007

(51) Int. Cl.
*H01L 27/04* (2006.01)
*H01L 27/06* (2006.01)

(52) U.S. Cl.
CPC .................................. *H01L 27/0629* (2013.01)
USPC ..................................... 257/379; 257/E27.01

(58) Field of Classification Search
USPC ..................... 257/379, 380, E27.01; 438/238
See application file for complete search history.

(56) References Cited

U.S. PATENT DOCUMENTS

| 5,801,418 A * | 9/1998 | Ranjan ........................... 257/336 |
| 2009/0283825 A1* | 11/2009 | Wang et al. ................... 257/335 |
| 2009/0284882 A1* | 11/2009 | Nakamura ....................... 361/56 |

FOREIGN PATENT DOCUMENTS

| JP | 05-335598 | 12/1993 |
| JP | 2007-27228 | 2/2007 |
| JP | 2008-227197 | 9/2008 |
| JP | 2009-032968 | 2/2009 |
| JP | 2009-32968 | 2/2009 |

OTHER PUBLICATIONS

Japanese Office Action dated Oct. 16, 2013, filed in Japanese counterpart Application No. 2010-151007.

* cited by examiner

*Primary Examiner* — Daniel Shook
(74) *Attorney, Agent, or Firm* — Patterson & Sheridan, LLP

(57) ABSTRACT

According to one embodiment, a semiconductor device including a field-effect transistor, and a resistance element connected between a gate electrode of the field effect transistor and a connection point connected between a back gate electrode of the field effect transistor and one of source-drain regions of the field effect transistor, a voltage being applied between the other of the source-drain regions and the gate electrode.

22 Claims, 7 Drawing Sheets

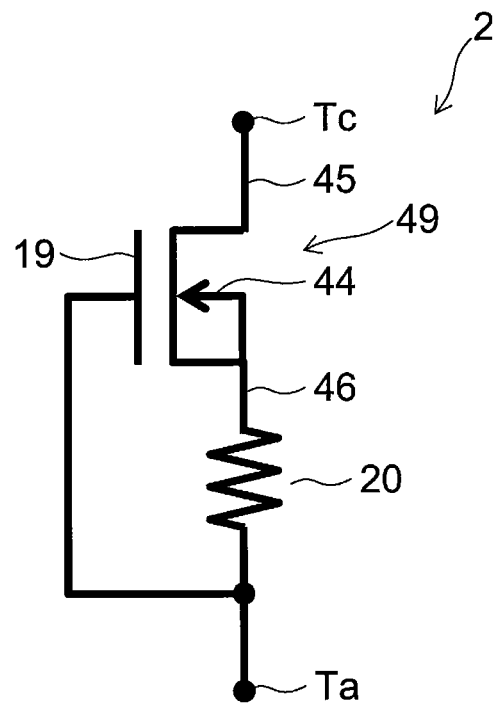
FIG. 6
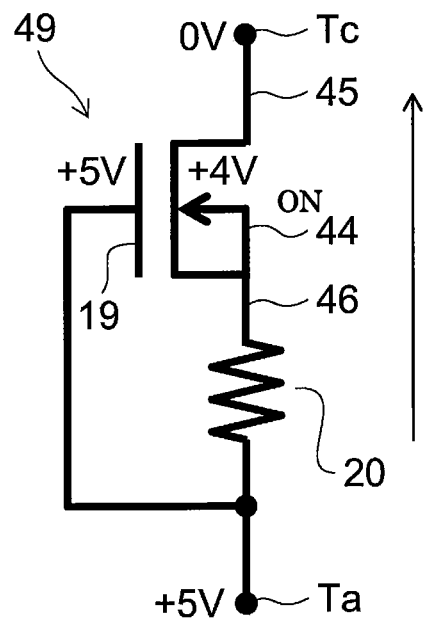 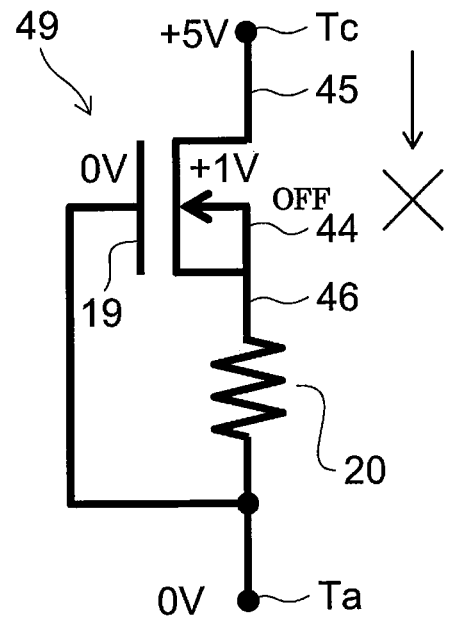
FIG. 7A                FIG. 7B

SEMICONDUCTOR DEVICE

CROSS REFERENCE TO RELATED APPLICATION

This application is based upon and claims the benefit of priority from prior Japanese Patent Application No. 2010-151007, filed on Jul. 1, 2010, the entire contents of which are incorporated herein by reference.

FIELD

Exemplary embodiments described herein generally relate to a semiconductor device, and to the semiconductor device using a MOSFET (Metal-Oxide-Semiconductor Field-Effect Transistor) structure as a diode in particular.

BACKGROUND

An integrated circuit formed in a semiconductor device is often provided with a diode as a circuit element.

One method of forming such a diode includes forming the p-type region and the n-type region in contact with each other. Another method of forming such a diode makes use of a MOSFET structure.

When the diode is fabricated by using the MOSFET structure, the cost for designing a new diode can be saved, and characteristics of the diode, such as the breakdown voltage, can be enhanced up to the levels of the MOSFET.

BRIEF DESCRIPTION OF THE DRAWINGS

FIG. 6 is a circuit diagram illustrating the semiconductor device according to the second embodiment.

FIGS. 7A and 7B are circuit diagrams illustrating the operations of the semiconductor device according to the second embodiment.

DETAILED DESCRIPTION

According to one embodiment, a semiconductor device, including a field-effect transistor, and a resistance element connected between a gate electrode of the field effect transistor and a connection point connected between a back gate electrode of the field effect transistor and one of source-drain regions of the field effect transistor, a voltage being applied between the other of the source-drain regions and the gate electrode.

Hereinafter, embodiments of the invention will be described with reference to the drawings.

First of all, a first embodiment will be described.

Figure 1:
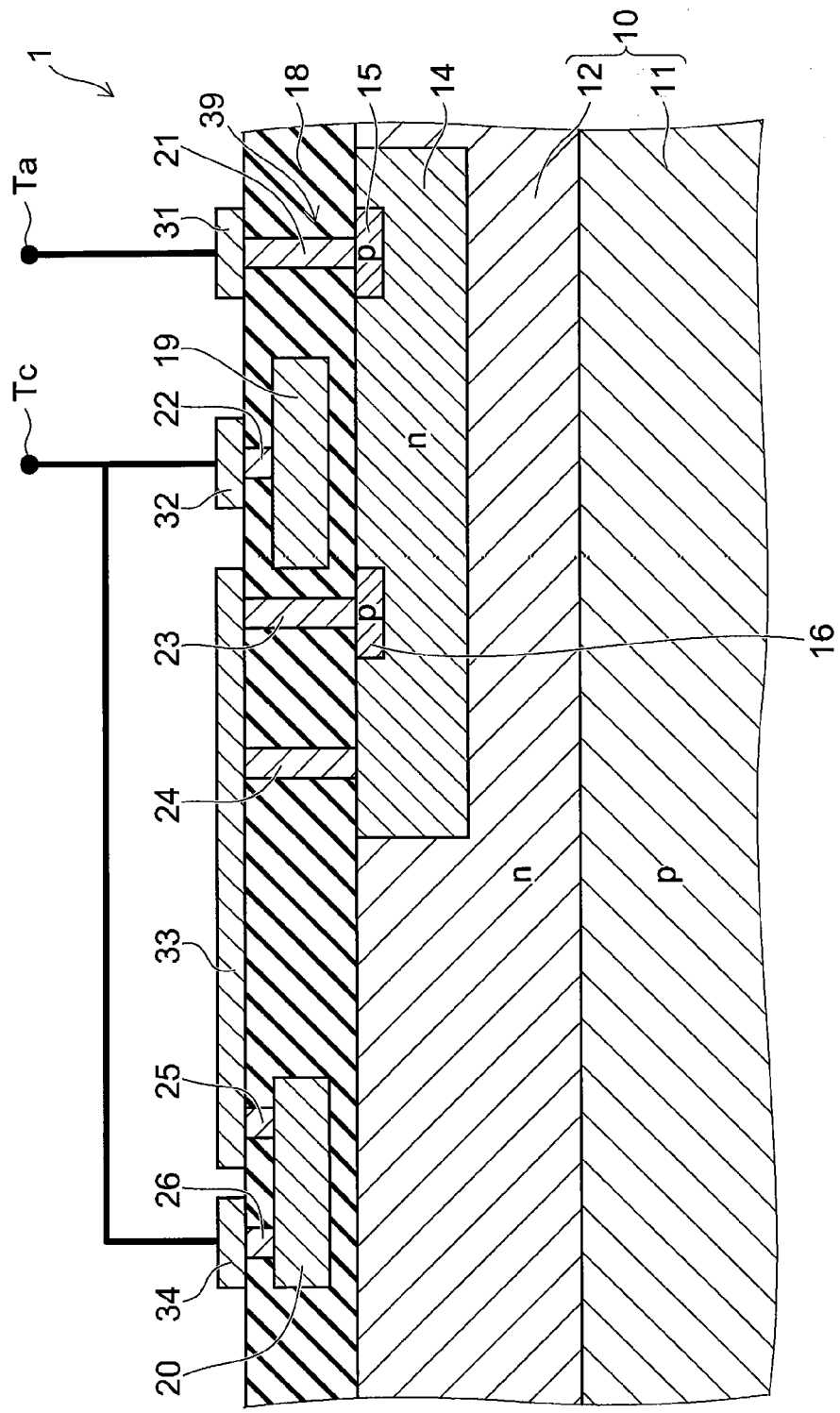
FIG. 1 is a cross-sectional view illustrating a semiconductor device according to a first embodiment.
Figure 2:
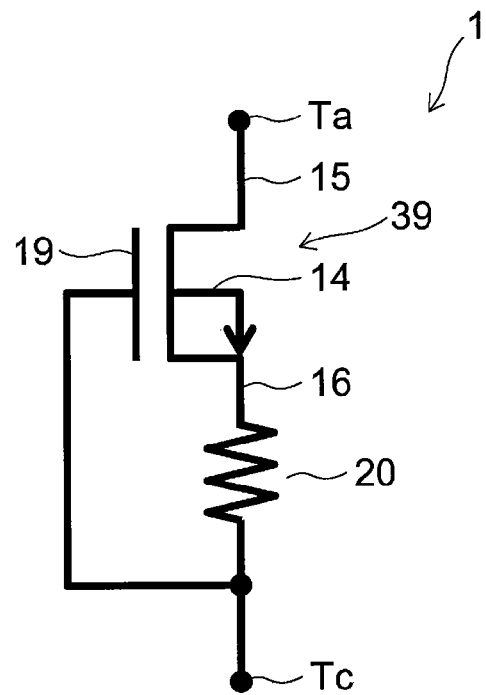
FIG. 2 is a circuit diagram illustrating the semiconductor device according to the first embodiment.

FIG. 1 is a cross-sectional view illustrating a semiconductor device according to the first embodiment. FIG. 2 is a circuit diagram illustrating the semiconductor device according to the first embodiment.

As shown in FIGS. 1 and 2, a semiconductor device 1 in the first embodiment is provided with a p-type silicon substrate 11 (second conductivity type base material). An n-type epitaxial layer 12 (first conductivity type layer) is formed on the p-type silicon substrate 11. A semiconductor substrate 10 is constituted with both the p-type silicon substrate 11 and the n-type epitaxial layer 12. An n-type channel region 14 is formed in an upper portion of the n-type epitaxial layer 12. The channel region 14 has an effective impurity concentration which is higher than that of the n-type epitaxial layer 12. Note that the effective impurity concentration means the concentration of an impurity which contributes to the conductivity of a semiconductor material. For example, in a case where a semiconductor material contains both a donor impurity and an acceptor impurity, the effective impurity concentration is defined as the concentration of either the activated donor impurity or the activated acceptor impurity in excess of the other activated impurity after offset between the two activated impurities. P-type source-drain regions 15, 16 are formed in upper portions of the channel region 14 in a way to be isolated from each other.

An insulating film 18 composed of a silicon oxide, for example, is formed on the semiconductor substrate 10. A gate electrode 19 composed of a poly-crystalline silicon doped with an impurity, for example, is formed in the insulating film 18. The gate electrode 19 is formed in an area right above an area located between the source-drain regions 15, 16. The gate electrode 19 is isolated from the semiconductor substrate 10 with a portion of the insulating film 18 located in between. In addition, a conductive film composed of a poly-crystalline silicon doped with an impurity, for example, is formed in an area in the insulating film 18, and out of the area right above the channel region 14. The conductive film 20 is a resistance element with a predetermined resistance.

In addition, contacts 21 to 26 are formed in the insulating film 18. Furthermore, interconnections 31 to 34 are formed on the insulating film 18. The bottom end of the contact 21 is connected to the source-drain region 15 whereas the top end of the contact 21 is connected to the interconnection 31. The bottom end of the contact 22 is connected to the gate electrode 19 whereas the top end of the contact 22 is connected to the interconnection 32. The bottom end of the contact 23 is connected to the source-drain region 16 whereas the top end of the contact 23 is connected to the interconnection 33. The bottom end of the contact 24 is connected to the channel region 14 whereas the top end of the contact 24 is connected to the interconnection 33. The bottom end of the contact 25 is connected to a first end portion of the conductive film 20 whereas the top end of the contact 25 is connected to the interconnection 33. The bottom end of the contact 26 is connected to the second end portion of the conductive film 20 whereas the top end of the contact 22 is connected to the interconnection 32. The interconnection 32 and the interconnection 34 are connected to each other.

Accordingly, the source-drain region 16 is connected to the channel region 14 via the contacts 23, the interconnection 33, and the contacts 24. In addition, the conductive film 20 is connected between the gate electrode 19 and the interconnection 33 to which both the channel region 14 and the source-drain region 16 are commonly connected. To be more specific, one end portion of the conductive film 20 is connected to the interconnection 33 via the contact 25 whereas the other end portion of the conductive film 20 is connected to the gate electrode 19 via the contact 26, the interconnection 34, the interconnection 32, and the contact 22. The interconnection 31 serves as an anode terminal Ta whereas the connection point between the interconnection 32 and the interconnection 34 serves as a cathode terminal Tc.

Accordingly, in the semiconductor device 1, a p-type MOSFET 39 is formed with the channel region 14, the source-drain regions 15, 16, the insulating film 18, and the gate electrode 19. The contacts 21, 23 connected respectively to the source-drain regions 15, 16 are served as the source-drain electrodes of the p-type MOSFET 39. In addition, the contact 24 connected to the channel region 14 is served as a back gate electrode of the p-type MOSFET 39. The contact 23 connected to the source-drain region 16, one of the two source-drain regions in the p-type MOSFET 39 and the contact 24, being served as the back gate electrode, are connected to each other via the interconnection 33. In addition, the conductive film 20 being served as a resistance element is connected between the interconnection 33, the connection point, and the gate electrode 19. Furthermore, the connection point between the gate electrode 19 and the conductive film 20 is served as a cathode terminal Tc. The anode terminal Ta and the cathode terminal Tc are external terminals of the p-type MOSFET 39, and are connected either to a portion other than the p-type MOSFET 39 within the semiconductor device 1 or to a portion outside of the semiconductor device 1. A voltage is applied between the anode terminal Ta and the cathode terminal Tc.

Next, operations of the semiconductor device of the first embodiment will be described.

Figure 3A:
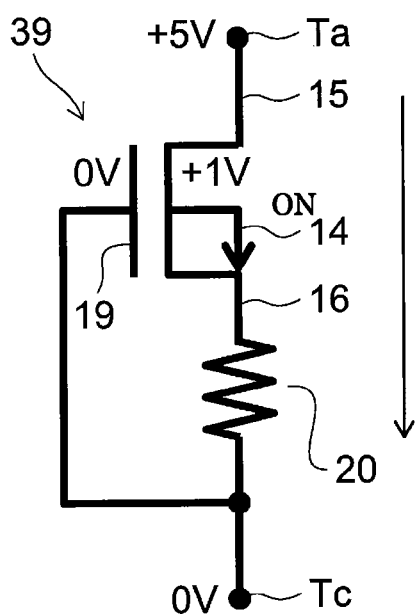
FIGS. 3A and 3B are circuit diagrams illustrating the operations of the semiconductor device according to the first embodiment.
Figure 3B:
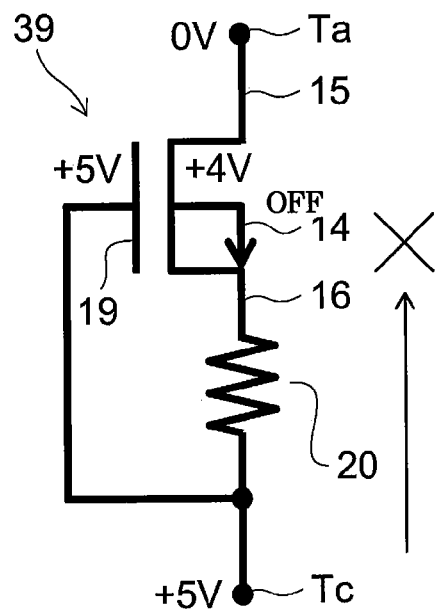

FIGS. 3A and 3B are circuit diagrams illustrating the operations of the semiconductor device according to the first embodiment. FIG. 3A shows a case where a higher voltage is applied to the anode terminal than to the cathode terminal. FIG. 3B shows the case where a higher voltage is applied to the cathode terminal than to the anode terminal.

supposing a case where a high potential (e.g., +5 V) is applied to the anode terminal Ta and a low potential (e.g., 0 V) is applied to the cathode terminal Tc, as shown in FIGS. 1 and 3A, the potential of +5 V is applied to the source-drain region 15 via the interconnection 31 and the contact 21. In addition, the potential of 0 V is applied to the gate electrode 19 via the interconnection 32 and the contact 22. In this case, since the conductive film 20 is connected between the cathode terminal Tc and the channel region 14, the resistance of the conductive film 20 raises the potentials of the source-drain region 16 and the channel region 14 over the potential of the cathode terminal Tc. Thus, the potentials of the source-drain region 16 and the channel region 14 are set to be potentials between the above-mentioned high potential and low potential. For example, the potentials of the source-drain region 16 and the channel region 14 are +1 V. Accordingly, the potential of the gate electrode 19 (e.g., 0 V) is set to be lower than that of the channel region 14 (e.g., +1 V). Thus, an inversion layer is induced in an uppermost portion of the channel region 14 between the source-drain region 15 and the source-drain region 16. Hence, the p-type MOSFET 39 is set to be a conductive state. Accordingly, an electric current flows from the anode terminal Ta to the cathode terminal Tc via the p-type MOSFET 39.

On the other hand, in a case where a low potential (e.g., 0 V) is applied to the anode terminal Ta and a high potential (e.g., +5 V) is applied to the cathode terminal Tc, as shown in FIGS. 1 and 3B. In such the case, the potential of 0 V is applied to the source-drain region 15 via the interconnection 31 and the contact 21. In addition, the potential of +5 V is applied to the gate electrode 19 via the interconnection 32 and the contact 22. The potentials of the source-drain region 16 and the channel region 14 is decreased under the potential of the cathode terminal Tc due to the resistance of the conductive film 20. Thus, the potentials of the source-drain region 16 and the channel region 14 are set to be potentials between the above-mentioned high potential and low potential. For example, the potentials of both the source-drain region 16 and the channel region 14 are +4 V. Accordingly, the potential of the gate electrode 19 (e.g., +5 V) is set to be higher than that of the channel region 14 (e.g., +4 V). Hence, the p-type MOSFET 39 is set to be a non-conductive state. Accordingly, no electric current flows between the anode terminal Ta and the cathode terminal Tc.

Next, effects of the first embodiment will be described. As has been described earlier, the p-type MOSFET 39 allows the electric current to flow from the anode terminal Ta to the cathode terminal Tc, however, no electric current to flow from the cathode terminal Tc to the anode terminal Ta. To put it differently, the p-type MOSFET 39 acts as a diode. In addition, since the p-type MOSFET 39 allows or blocks the flow of the electric current on the basis of a MOSFET operation, little electric current flows from the anode terminal Ta to the cathode terminal Tc leaks out to the semiconductor substrate 10. That is to say, a small amount of leakage current flows out to the semiconductor substrate 10. Accordingly, the loss of electric current can be reduced, and the noise current can be reduced. Consequently, when the semiconductor device 1 is used as a signal processor, the waveforms of the signals are less likely to be disturbed.

Figure 4:
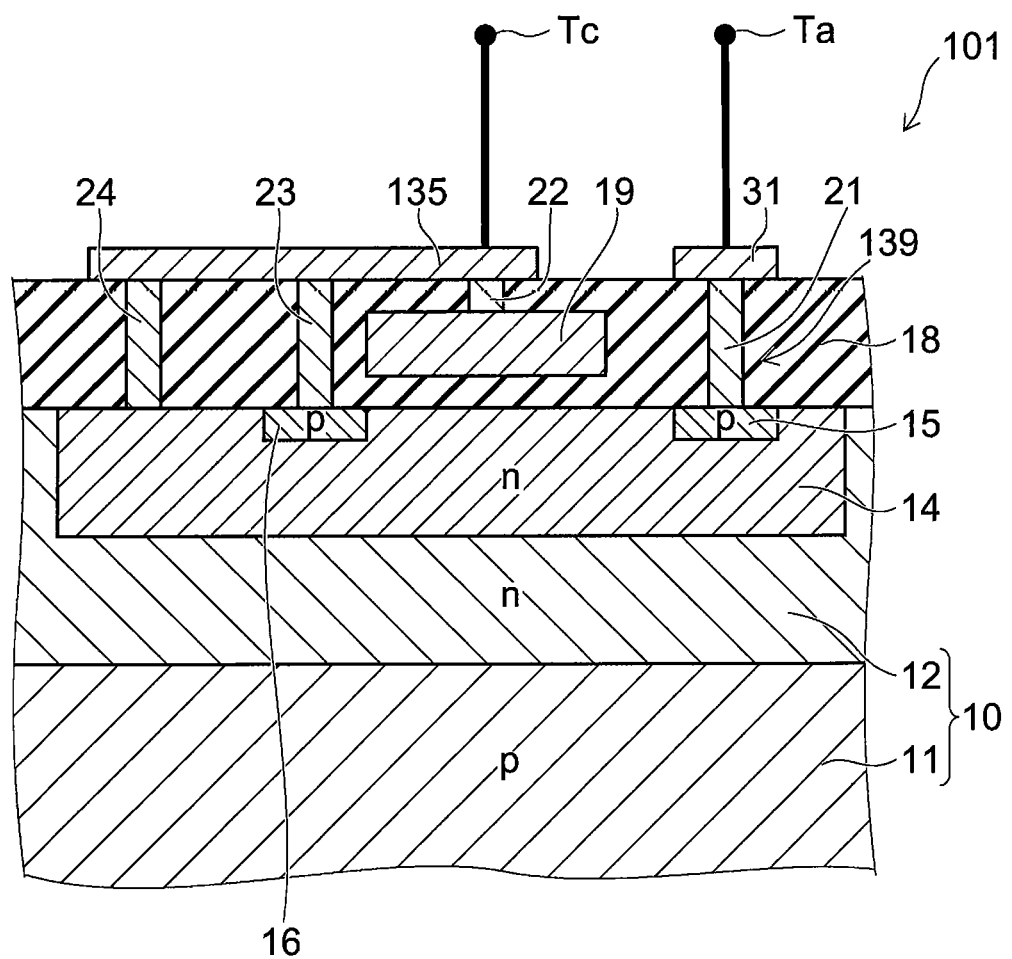
FIG. 4 is a cross-sectional view illustrating a semiconductor device according to a comparative example.

Next, descriptions will be provided for a comparative example. FIG. 4 is a cross-sectional view illustrating a semiconductor device according to a comparative example. As shown in FIG. 4, a p-type MOSFET 139 is formed in a semiconductor device 101 in the comparative example. The configuration of the p-type MOSFET 139 is basically similar to that of the p-type MOSFET 39 of the first embodiment (see FIG. 1), however, no conductive film 20 (see FIG. 1) serving as a resistance element is provided in this comparative example. In addition, the semiconductor device 101 in this comparative example includes an interconnection 135 in place of the interconnections 32, 33 (see FIG. 1). The interconnection 135 is commonly connected to the gate electrode 19, the source-drain region 16, and the channel region 14. The interconnection 135 thus connected is served as the cathode terminal Tc.

In this comparative example, the anode terminal Ta is connected to the p-type source-drain region 15 via the interconnection 31 and the contact 21 whereas the cathode terminal Tc is connected to the n-type channel region 14 via the interconnection 135 and the contact 24. Accordingly, a p-n junction is formed between the p-type source-drain region 15 and the n-type channel region 14, so that p-type MOSFET 139 acts as a diode.

In this comparative example, however, a vertical-type pnp parasitic bipolar transistor is formed by the p-type source-drain regions 15, the n-type channel region 14, the n-type epitaxial layer 12, and the p-type silicon substrate 11. When the pnp parasitic bipolar transistor is turned on, a leakage current flows from the source-drain region 15 to the p-type silicon substrate 11. Accordingly, the electric current that flows from the anode terminal Ta to the cathode terminal Tc decreases to lower the current efficiency. In addition, the electric current leaked out to the p-type silicon substrate 11 act as a noise current. Accordingly, when the semiconductor device 101 is used as a signal processor, the waveforms of signals are disturbed.

Figure 5:
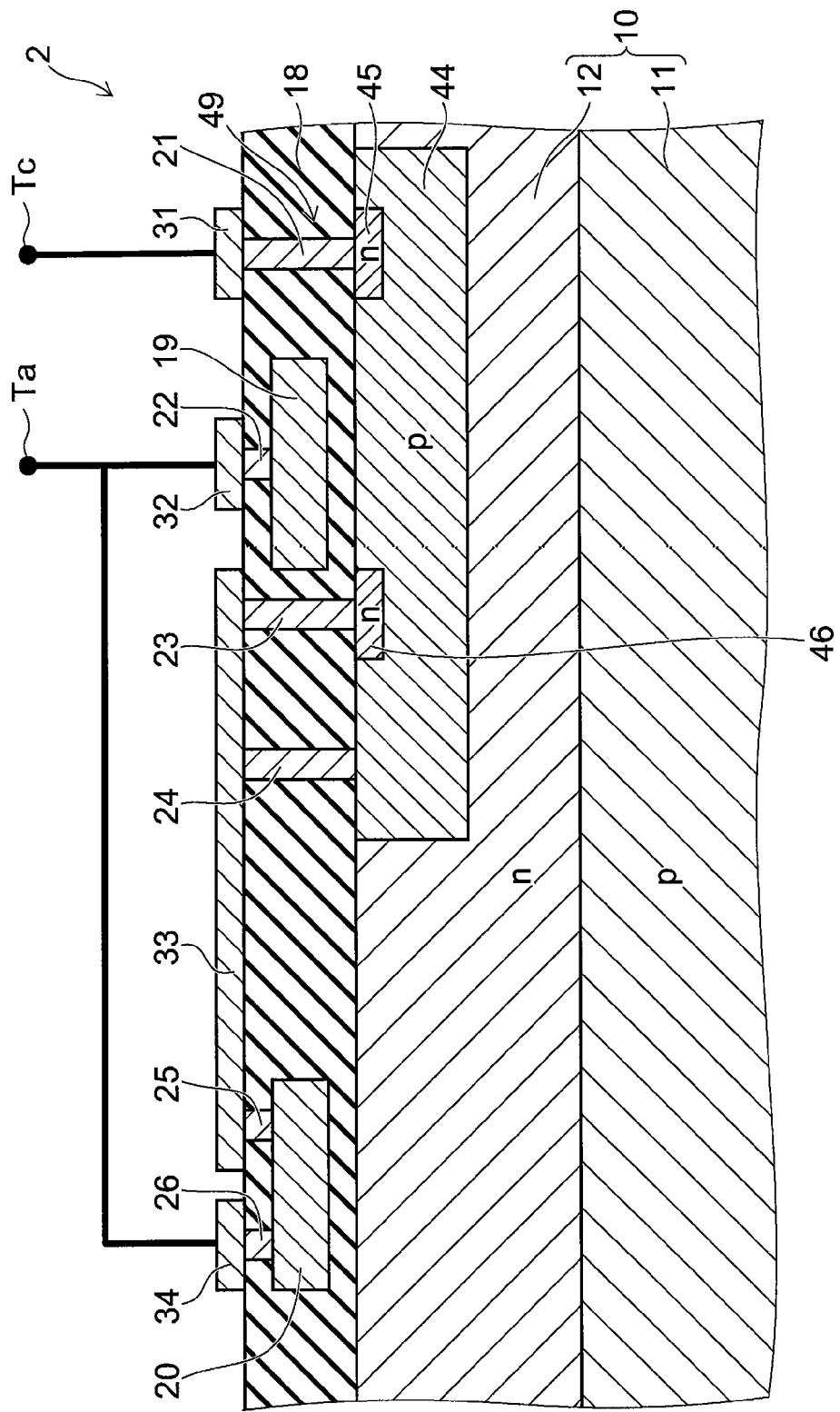
FIG. 5 is a cross-sectional view illustrating a semiconductor device according to a second embodiment.

Next, descriptions will be provided for a second embodiment. FIG. 5 is a cross-sectional view illustrating a semiconductor device according to the second embodiment. FIG. 6 is a circuit diagram illustrating the semiconductor device according to the second embodiment. As shown in FIGS. 5 and 6, a semiconductor device 2 in the second embodiment differs from the semiconductor device 1 in the first embodiment (see FIGS. 1 and 2) in that, instead of the p-type MOSFET 39, an n-type MOSFET 49 is formed in this embodiment.

In the semiconductor device 2 in this embodiment, a semiconductor substrate 10 includes a p-type silicon substrate 11 and an n-type epitaxial layer 12 formed on the p-type silicon substrate 11 as in the case of the first embodiment. In the first embodiment, the channel region 14 has the n-type conductivity, and the source-drain regions 15, 16 have the p-type conductivity. On the other hand, in this embodiment, a channel region 44 has the p-type conductivity, and source-drain regions 45, 46 have the n-type conductivity. Thus, the n-type MOSFET 49 is formed.

In addition, in the semiconductor device 2, the source-drain region 46 and the channel region 44 are connected to each other as in the case of the first embodiment. Furthermore, a conductive film 20 is provided, and is connected between a gate electrode 19 and a connection point between the source-drain region 46 and the channel region 44. As contrary to the case of the first embodiment, an interconnection 31 connected to the source-drain region 45 is served as a cathode terminal Tc, and the connection point between the conductive film 20 and the gate electrode 19 is served as an anode terminal Ta. Other than in the configuration mentioned above in this embodiment is similar to that of the configuration mentioned before in the first embodiment.

Next, operations of the semiconductor device of this embodiment will be described. FIGS. 7A and 7B are circuit diagrams illustrating the operations of the semiconductor device in this embodiment. FIG. 7A shows a case where a higher voltage is applied to the anode terminal than to the cathode terminal. FIG. 3B shows the case where a higher voltage is applied to the cathode terminal than to the anode terminal.

Supposing a case where a high potential (e.g., +5 V) is applied to the anode terminal Ta and a low potential (e.g., 0 V) is applied to the cathode terminal Tc, as shown in FIGS. 5 and 7A, the potential of 0 V is applied to the source-drain region 45 via the interconnection 31 and the contact 21. In addition, the potential of +5 V is applied to the gate electrode 19 via the interconnection 32 and the contact 22. In this case, since the conductive film 20 is connected between the cathode terminal Tc and the channel region 44, the potentials of the source-drain region 46 and the channel region 44 are decreased under the potential of the cathode terminal Tc due to the resistance of the conductive film 20. Thus, the potentials of the source-drain region 46 and the channel region 44 are set to be potentials between the above-mentioned high potential and low potential. For example, the potentials of the source-drain region 46 and the channel region 44 are +4 V. Accordingly, the potential of the gate electrode 19 (e.g., +5 V) becomes higher than that of the channel region 44 (e.g., +4 V). Thus, an inversion layer is induced in an uppermost portion of the channel region 44 between the source-drain region 45 and the source-drain region 46. Hence, the n-type MOSFET 49 is set to be a conductive state. Accordingly, an electric current flows from the anode terminal Ta to the cathode terminal Tc via the n-type MOSFET 49.

On the other hand, in a case where a low potential (e.g., 0 V) is applied to the anode terminal Ta and a high potential (e.g., +5 V) is applied to the cathode terminal Tc, as shown in FIGS. 5 and 7B. In such the case, the potential of +5 V is applied to the source-drain region 45 via the interconnection 31 and the contact 21. In addition, the potential of 0 V is applied to the gate electrode 19 via the interconnection 32 and the contact 22. The resistance of the conductive film 20 raises the potentials of the source-drain region 46 and the channel region 44 over the potential of the cathode terminal Tc. Thus, the potentials of the source-drain region 46 and the channel region 44 is set to be the potentials between the above-mentioned high potential and low potential. For example, the potentials of the source-drain region 46 and the channel region 44 are +1 V. Accordingly, the potential of the gate electrode 19 (e.g., 0 V) is set to be lower than that of the channel region (e.g., +1 V). Hence, the n-type MOSFET 49 is set to a non-conductive state. Accordingly, no electric current flows between the anode terminal Ta and the cathode terminal Tc.

Next, effects of this embodiment will be described. The effects of this embodiment are the same as those of the first embodiment which has been described above. To put it specifically, the n-type MOSFET 49 allows the electric current to flow from the anode terminal Ta to the cathode terminal Tc, however, no electric current to flow from the cathode terminal Tc to the anode terminal Ta. For this reason, the n-type MOSFET 49 functions as a diode. In addition, since the n-type MOSFET 49 allows or blocks the flow of the electric current on the basis of a MOSFET operation, little electric current leaks out to the semiconductor substrate 10. That to say, a small amount of leakage current flows out to the semiconductor substrate 10. Accordingly, the loss of electric current can be reduced. Consequently, when the semiconductor device 2 is used as a signal processor, the waveforms of the signals are less likely to be disturbed.

Figure 8:
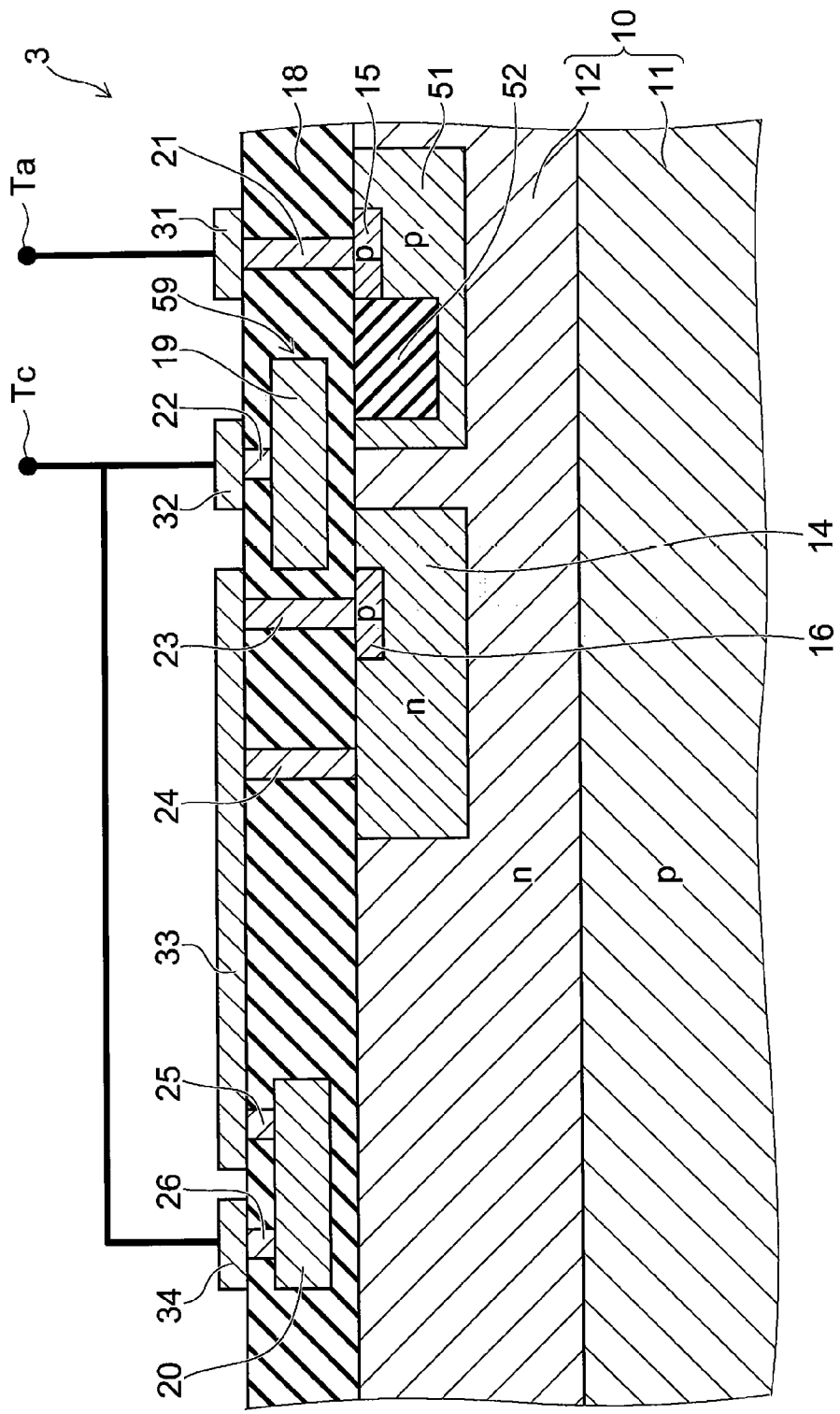
FIG. 8 is a cross-sectional view illustrating semiconductor device according to a third embodiment.

Next, descriptions will be provided for a third embodiment. FIG. 8 is a cross-sectional view illustrating a semiconductor device in the third embodiment. As shown in FIG. 8, a semiconductor device 3 in this embodiment differs from the semiconductor device 1 in the first embodiment (see FIGS. 1 and 2) in that a p-type RESURF (reduced surface field) region 51 is formed in an upper portion of an n-type epitaxial layer 12 and a source-drain region 15 is formed in the RESURF region 51 instead of a channel region 14. In addition, as an insulator, an STI (shallow trench isolation) 52 is formed in the RESURF region 51.

To be more specific, the RESURF region 51 is isolated from the channel region 14, and a portion of the n-type epitaxial layer 12 is located between the RESURF region 51 and the channel region 14. The RESURF region 51 has an effective impurity concentration which is lower than the effective impurity concentration of the source-drain region 15. The STI 52 is composed of an insulating material, for example, a silicon oxide. The STI 52 is formed in an upper portion of the RESURF region 51 between source-drain regions 15, 16, and is in contact with the source-drain region 15. The top surface of the STI 52 is exposed out the top surface of the semiconductor substrate 10 whereas the undersurface of the STI 52 is positioned below the undersurfaces of the source-drain regions 15, 16.

The gate electrode 19 is formed above an area located between the source-drain regions 15, 16, however, not formed in an area right above a portion of the STI 52 closer to the source-drain region 15. Accordingly, in this embodiment, a p-type laterally diffused MOSFET (LDMOS) 59 is formed with the n-type epitaxial layer 12, the channel region 14, the RESURF region 51, the source-drain regions 15, 16, the insulating film 18, and the gate electrode 19. Other than in the configuration mentioned above in this embodiment is similar to that of the configuration mentioned before in the first embodiment.

In this embodiment, the source-drain region 15 is formed in the p-type RESURF region 51, and the RESURF region 51 is isolated from the channel region 14 with a portion of the n-type epitaxial layer 12 located in between. In addition, the STI 52 is formed between the source-drain regions 15, 16 in a way to reach a deeper position than the source-drain regions 15, 16. Accordingly, the p-type LDMOS 59 is constituted with the n-type epitaxial layer 12, the channel region 14, the RESURF region 51, the source-drain regions 15, 16, the insulating film 18, and the gate electrode 19. The p-type LDMOS 59 has a higher breakdown voltage between the source-drain region 15 and the source-drain region 16 than the p-type MOSFET 39 in the first embodiment (see FIG. 1). The other effects obtainable in this embodiment are similar to those obtainable in the first embodiment. In other words, the semiconductor device 3 in this embodiment can be represented by the same circuit diagram that is shown in FIG. 2.

Figure 9:
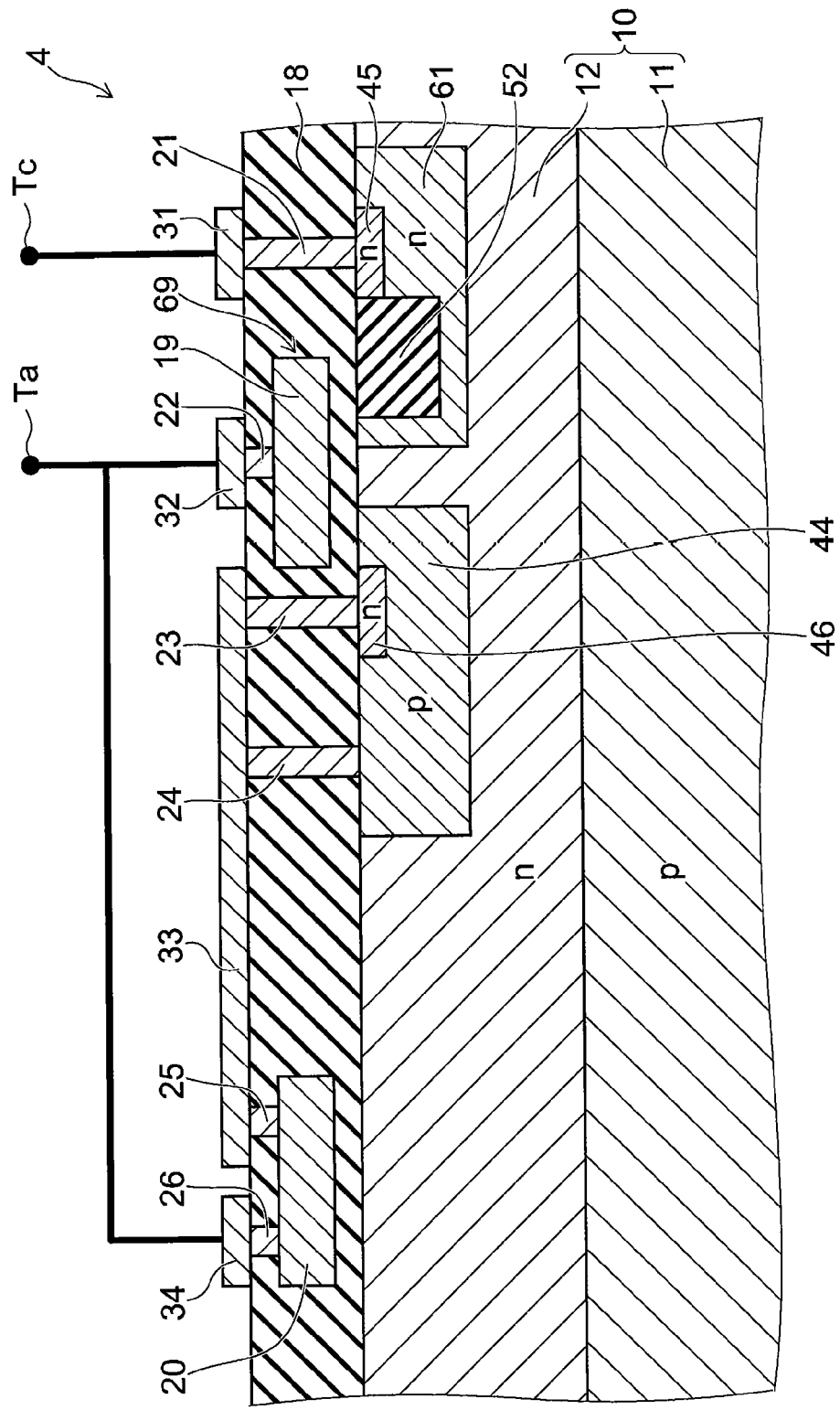
FIG. 9 is a cross-sectional view illustrating a semiconductor device according to a fourth embodiment.

Next, descriptions will be provided for a fourth embodiment. FIG. 9 is a cross-sectional view illustrating a semiconductor device according to the fourth embodiment. As shown in FIG. 9, the fourth embodiment is obtained by combining the second and the third embodiments. To put it specifically, a semiconductor device 4 in the fourth embodiment differs from the semiconductor device 3 (see FIG. 8) of the third embodiment in that an n-type LDMOS 69 is formed instead of the p-type LDMOS 59.

To be more specific, in the third embodiment, the channel region 14 has the n-type conductivity, the RESURF region 51 has the p-type conductivity, and the source-drain regions 15, 16 have the p-type conductivity. On the other hand, in the fourth embodiment, a channel region 44 has the p-type conductivity, a RESURF region 61 has the n-type conductivity, and source-drain regions 45, 46 have the n-type conductivity. Other than in the configuration mentioned above in this embodiment is similar to that of the configuration mentioned before in the third embodiment.

The n-type LDMOS 69 in this embodiment has a higher breakdown voltage between the source and drain regions than the n-type MOSFET 49 in the second embodiment. The other effects obtainable in this embodiment are similar to those obtainable in the second embodiment. In other words, the semiconductor device 4 in this embodiment can be represented by the same circuit diagram that is shown in FIG. 6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above-described embodiments, the semiconductor substrate 10 is provided with the n-type epitaxial layer 12 on the p-type silicon substrate 11. However, the semiconductor substrate 10 with the above-described configuration is not the only possible semiconductor substrate 10 as the embodiment. For example, an n-type diffusion layer doped with a donor impurity may be formed in the upper portion of the p-type silicon substrate. Alternatively, the semiconductor substrate 10 may be a substrate with a single conductivity type, or may be an SOI (silicon on insulator) substrate.

In addition, in the above-described embodiments, the resistance element is provided as the conductive film 20 composed of a poly-crystalline silicon, however, this is not the only possible configuration for the embodiment. For example, resistance may be added by elongating the interconnection between the contact 22 and the contacts 23, 24. Alternatively, a low-concentration region with a low effective impurity concentration may be formed in the semiconductor substrate 10 so as to serve as a resistance element.

The above-described embodiments can provide a semiconductor device with little leakage current to the semiconductor substrate.

What is claimed is:

1. A semiconductor device, comprising:
a field-effect transistor; and
a resistance element connected between a gate electrode of the field effect transistor and a back gate electrode of the field effect transistor through a one of source-drain regions of the field effect transistor, a voltage being applied between the other one of the source-drain regions and a connection point between the resistance element and the gate electrode.

2. The semiconductor device of claim 1, further comprising:
a first interconnection connected between the gate electrode and the resistance element.

3. The semiconductor device of claim 2, further comprising:
a second interconnection connected between the back gate electrode and the resistance element.

4. The semiconductor device of claim 3, wherein
the first interconnection is connected to a first end portion of the resistance element via a first contact element; and
the second interconnection connected to a second end portion of the resistance via a second contact element.

5. The semiconductor device of claim 3, wherein
the first interconnection and the second interconnection are formed in different device layers from each other.

6. The semiconductor device of claim 1, wherein
the resistance element and the gate electrode are composed of a same material.

7. The semiconductor device of claim 1, wherein the gate electrode and the resistance element are formed in an insulating layer disposed on a semiconductor layer.

8. The semiconductor device of claim 7, further comprising a interconnection element connecting the back gate electrode and the resistance element, the interconnection being disposed on the insulating layer.

9. A semiconductor device, comprising:
a semiconductor layer;
a first diffusion region with a first conductivity type formed in the semiconductor layer;
second and third diffusion regions with a second conductivity type formed in the first diffusion region to be isolated from each other;
an insulating film formed on the semiconductor layer and the first diffusion region;
a gate electrode formed between the second diffusion region and the third diffusion region;
a resistance element connected between the gate electrode and the first diffusion region through the third diffusion region;
a first terminal connected to the second diffusion region; and a second terminal connected to a connection point between the resistance element and the gate electrode.

10. The semiconductor device of claim 9, wherein the semiconductor layer includes a second conductivity type base material and a first conductivity type layer formed on the second conductivity type base material, the first diffusion region being formed in the first conductivity type layer.

11. The semiconductor device of claim 9, wherein the resistance element is a conductive film formed in a same device layer as the gate electrode.

12. The semiconductor device of claim 11, wherein the gate electrode and the conductive film are composed of poly-crystalline silicon.

13. The semiconductor device of claim 11, wherein the gate electrode and the conductive film each comprise poly-crystalline silicon doped with a same impurity.

14. The semiconductor device of claim 9, wherein the resistance element comprises a low-concentration region of the semiconductor layer having a low effective impurity concentration.

15. The semiconductor device of claim 9, wherein the resistance element and the gate electrode are composed of a same material.

16. A semiconductor device, comprising:
a semiconductor layer;
a first diffusion region with a first conductivity type formed in the semiconductor layer;
a second diffusion region with a second conductivity type formed in the semiconductor layer;
a third diffusion region with the second conductivity type formed in the second diffusion region;
a fourth diffusion region with the second conductivity type formed in the first diffusion region;
an insulating film formed on the semiconductor layer and the first diffusion region;
a gate electrode formed between the third diffusion region and the fourth diffusion region;
a resistance element connected between the gate electrode and the first diffusion region through the fourth diffusion region;
a first terminal connected to the third diffusion region; and
a second terminal connected to a connection point between the resistance element and the gate electrode.

17. The semiconductor device of claim 16, wherein the semiconductor layer includes a second conductivity type base material and a first conductivity type layer formed on the second conductivity type base material, the first diffusion region and the second diffusion region being formed in the first conductivity type layer.

18. The semiconductor device of claim 16, further comprising:
an insulating region formed adjacent to the third diffusion region in the second diffusion region, wherein a portion of the insulating region is formed below the gate electrode.

19. The semiconductor device of claim 18, wherein
a top surface of the insulating region is exposed on a top surface of the second diffusion region, and
a bottom surface of the insulating region is positioned at a level that is lower than a bottom surface of the third diffusion region and a bottom surface of the fourth diffusion region.

20. The semiconductor device of claim 16, wherein an effective impurity concentration of the second diffusion region is lower than an effective impurity concentration of the third diffusion region.

21. The semiconductor device of claim 16, wherein the resistance element is a conductive film formed in a same device layer as the gate electrode.

22. The semiconductor device of claim 21, wherein the gate electrode and the conductive film are composed of poly-crystalline silicon.

\* \* \* \* \*